US012805234B2

(12) United States Patent
Suarez Segovia et al.

(10) Patent No.: US 12,805,234 B2
(45) Date of Patent: Nov. 17, 2026

(54) METHOD FOR DICING A SEMICONDUCTOR WAFER

(71) Applicant: STMicroelectronics International N.V., Geneva (CH)

(72) Inventors: Carlos Augusto Suarez Segovia, Seyssinet-pariset (FR); David Parker, Greasque (FR); Pierre Bar, Grenoble (DE)

(73) Assignee: STMicroelectronics International N.V., Geneva (CH)

( * ) Notice: Subject to any disclaimer, the term of this patent is extended or adjusted under 35 U.S.C. 154(b) by 332 days.

(21) Appl. No.: 18/602,230

(22) Filed: Mar. 12, 2024

(65) Prior Publication Data

US 2024/0321639 A1 Sep. 26, 2024

(30) Foreign Application Priority Data

Mar. 23, 2023 (FR) ...................................... 2302754

(51) Int. Cl.

| | |
|---|---|
| ***H10P 54/00*** | (2026.01) |
| ***H10P 50/26*** | (2026.01) |
| ***H10P 50/28*** | (2026.01) |
| ***H10W 42/00*** | (2026.01) |
| ***H10W 74/10*** | (2026.01) |

(52) U.S. Cl.

CPC ............ *H10P 54/00* (2026.01); *H10P 50/267* (2026.01); *H10P 50/283* (2026.01); *H10W 42/00* (2026.01); *H10W 42/121* (2026.01); *H10W 74/147* (2026.01)

(58) Field of Classification Search

CPC ...... H10P 54/00; H10P 50/267; H10P 50/283; H10W 42/00; H10W 42/121; H10W 74/147

See application file for complete search history.

(56) References Cited

U.S. PATENT DOCUMENTS

| | | | | |
|---|---|---|---|---|
| 2014/0354396 | A1 | 12/2014 | Nukaga et al. | |
| 2017/0053902 | A1* | 2/2017 | Yu | H10W 20/023 |
| 2019/0304910 | A1* | 10/2019 | Fillion | H03K 19/017545 |
| 2020/0312715 | A1* | 10/2020 | Choi | H10P 52/00 |
| 2021/0057328 | A1 | 2/2021 | Lee et al. | |
| 2021/0391279 | A1* | 12/2021 | Sugioka | H10B 12/09 |
| 2022/0336373 | A1* | 10/2022 | Yamaguchi | H10W 42/121 |

OTHER PUBLICATIONS

INPI Search Report and Written Opinion for priority application, FR Appl. No. 2302754, report dated Nov. 7, 2023, 11 pgs.

* cited by examiner

*Primary Examiner* — Yasser A Abdelaziez

(74) *Attorney, Agent, or Firm* — Crowe & Dunlevy LLC

(57) ABSTRACT

A wafer includes a semiconductor substrate, an interconnection network provided with metal layers and at least one ultra-low dielectric constant dielectric layer, at least one contact region and at least one dicing region. A hard mask is formed having a pattern that defines a dicing line. The formation of the hard mask includes a first etching of an opening in the dicing region to expose the semiconductor substrate in the dicing region, a second etching of an opening in the contact region to expose a surface of a metal contact in the contact region, and a chemical treatment for cleaning the uncovered surface of the metal contact. A vertical dielectric layer is deposited to cover edges of the opening defining the dicing line. This layer is deposited before the chemical treatment is performed.

15 Claims, 8 Drawing Sheets

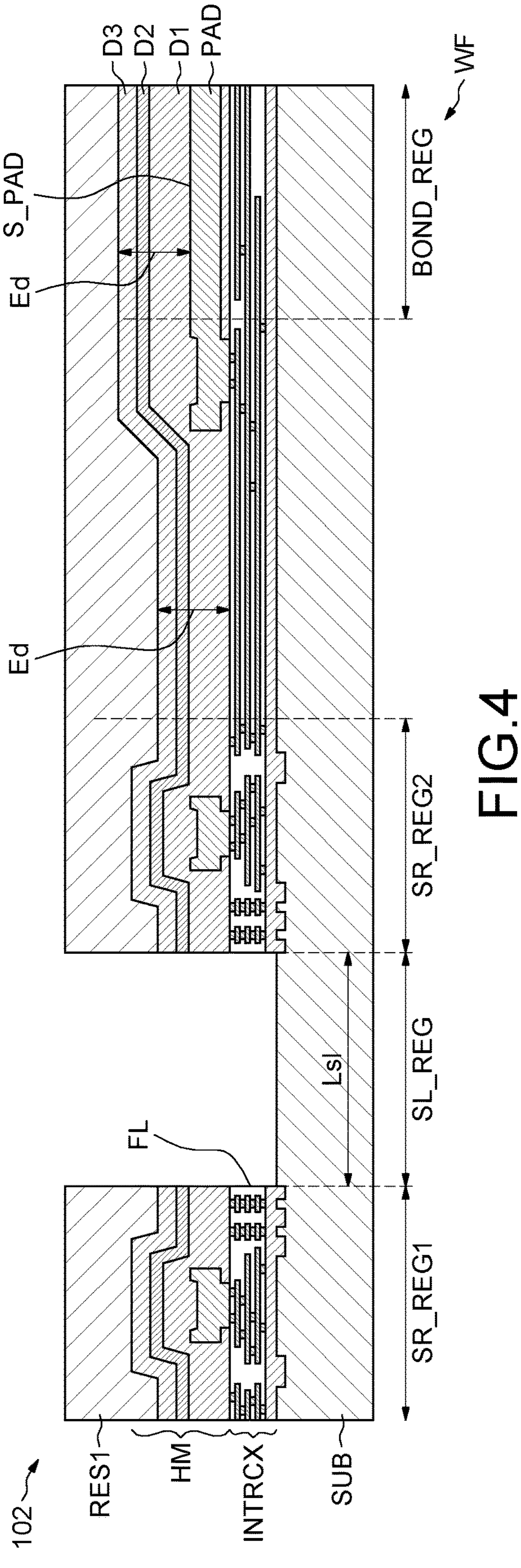
FIG.3
FIG.4
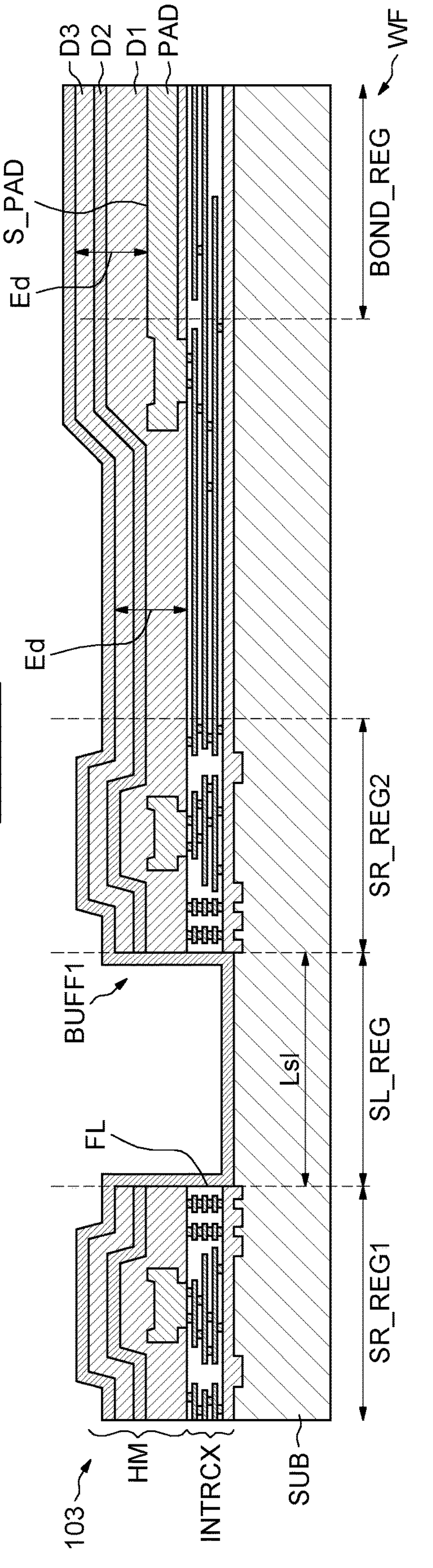

METHOD FOR DICING A SEMICONDUCTOR WAFER

PRIORITY CLAIM

This application claims the priority benefit of French Application for Patent No. 2302754, filed on Mar. 23, 2023, the content of which is hereby incorporated by reference in its entirety to the maximum extent allowable by law.

TECHNICAL FIELD

Embodiments and implementations relate to microelectronics and, in particular, dicing in a semiconductor wafer of semiconductor devices including ultra-low dielectric constant (referred to in the art as "ultra low-k") layers.

BACKGROUND

Semiconductor devices are typically manufactured from a semiconductor wafer and are separated (commonly referred to as "singulated") during a cutting step.

Semiconductor devices particularly typically comprise an interconnection network (commonly referred to a Back-End Of Line (BEOL) on a semiconductor part particularly including electronic components such as transistors (also referred to as Front-End Of Line (FEOL).

The interconnection network typically includes metal layers and can advantageously include ultra-low dielectric constant layers.

Usually, "ultra-low dielectric constant dielectric material" refers to dielectrics which have a dielectric constant "k" or "kappa" less than 95% of the dielectric constant value of silicon oxide.

The dicing step, during which the semiconductor devices are singulated, is typically preceded by a step of forming a hard mask for exposing dicing lines on the semiconductor wafer, i.e., the regions of the wafer wherein dicing is to be performed.

The hard mask makes it possible to protect the interconnection network on the rest of the semiconductor wafer from etching. Metal blocks of the semiconductor device are exposed by forming an opening in the hard mask, but have little or no reaction to the etching of the step of singulating the semiconductor devices.

The dicing lines and the opening in the hard mask to expose the metal blocks can be etched simultaneously in the hard mask. However, the etching time to form the dicing lines can be longer than the sufficient time to expose the metal blocks, since layers of the interconnection network are also etched in the dicing lines in addition to the hard mask layer. The etching of the opening, when it is performed at the same time as that forming the dicing lines, can therefore be extended onto the uncovered metal blocks and produce sputtering of the metal contaminating the vacuum chambers wherein the etchings are carried out.

The etchings to form the dicing lines and expose the metal blocks can also be carried out independently. In this case, a thick mask of photosensitive resin is used to delimit the openings exposing metal blocks. Nevertheless, the mask is liable to have a poor adherence on the wafer, and during the steps of removing this temporary mask, delaminations can appear in the dielectric layers of the interconnection network located at the edge of the dicing lines. Furthermore, a step of chemical treatment of the metal blocks typically takes place after removing this temporary mask and is also liable to cause delaminations. These delaminations, in addition to damaging the dielectric layers of the interconnection network, can permit moisture penetration into these layers which can result in a drift of the characteristics and performances of the semiconductor devices. The delamination risk is even more likely when the dielectric layers of the interconnection network are of the "ultra-low dielectric constant" type.

Thus, these is a need to limit the risk of degradation of the ultra-low dielectric constant dielectric constant.

SUMMARY

According to an aspect, a method is proposed for dicing a semiconductor wafer including a semiconductor substrate, an interconnection network provided with metal layers and at least one ultra-low dielectric constant dielectric layer, at least one contact region and at least one dicing region, having for example a width less than 100 μm, the method comprising: forming a hard mask wherein the pattern defines the dicing line, wherein forming the hard mask comprises: forming dielectric layers on the wafer in the contact region and in the dicing region; a first etching producing an opening in the dicing region via said layers of the interconnection network; a second etching producing an opening in the contact region uncovering a metal contact of the interconnection network; and cleaning the uncovered surface of the metal contact using a chemical treatment.

The method further comprises depositing a vertical dielectric layer covering the edges of the opening defining the dicing line, before said chemical treatment of cleaning the metal contact.

Thus, it is proposed according to this aspect, to protect the ultra-low dielectric constant dielectric layer(s), which is exposed at the edge of the dicing line of the wafer, particularly during the chemical treatment of cleaning the metal contact. The term "formation of a hard mask" denotes an embodiment in several steps for shaping a mask including a dielectric layer, generally made of silicon nitride, acting as a hard mask per se, but also including one or more passivation layers, generally silicon oxide, for protecting the wafer against corrosion for example. The hard mask thus formed by the method according to this aspect makes it possible to prevent, during the chemical treatment of the metal contact, damage of the ultra-low dielectric constant dielectric layer by delaminations capable of allowing moisture to enter this layer.

According to one implementation, said first etching is performed after said forming the dielectric layers, and through said dielectric layers and said layers of the interconnection network until the semiconductor substrate is uncovered, so as to shape said pattern of the hard mask defining the dicing line.

The first etching is advantageously configured not to produce delaminations in the ultra-low dielectric constant dielectric layers of the interconnection network. In this regard, the etching and masking techniques used to carry out this first etching can be the same techniques as those provided for the formation of the layers of the interconnection network, and particularly for the formation of the ultra-low dielectric constant dielectric layers.

According to one implementation, the first etching comprises forming a specific first temporary mask, the first temporary mask covering the dielectric layers in the contact region and uncovering the dielectric layers in the dicing region, and removing the dielectric layers and said layers of the interconnection network in the dicing region until the semiconductor substrate is uncovered in the pattern of the hard mask.

The formation of the first temporary mask, for example conventionally made of photosensitive lithographic resin, makes it possible to carry out the etching in the dicing region independently of the etching in the contact region. Indeed, the method according to this aspect enables an etching of the hard mask in two steps, making it possible to prevent the metal dispersion phenomenon, without causing damage of the dielectric layers of the interconnection network caused in the opening step uncovering the contact, given that the latter are protected by the vertical dielectric layer.

According to one implementation, depositing the vertical dielectric layer comprises depositing a conforming layer of a material chosen from silicon nitride or silicon oxide on the entire wafer.

The deposition of a conforming layer of silicon nitride or silicon oxide makes it possible to cover the surface of the wafer uniformly, in particular in the dicing region so that a vertical portion of the layer covers the layers of the interconnection network of the dicing region laterally. Silicon nitride, in addition to protecting the ultra-low dielectric constant dielectric layers from the risk of delamination, also offers superior adherence to the temporary mask.

According to one implementation, the second etching comprises: forming a specific second temporary mask covering the dicing region and uncovering the dielectric layers in the contact region, and removing the dielectric layers until a surface of the metal contact is uncovered.

The formation of the second temporary mask, for example conventionally made of photosensitive lithographic resin, makes it possible to carry out the etching in the contact region independently of the etching in the dicing region. The second etching being carried out independently of the first etching according to this aspect, can thus be optimized and configured specifically for the manufacture of the metal contact, without for all that causing damage to the dielectric layers of the interconnection network, given that the latter are protected by the vertical dielectric layer.

According to one implementation, said first etching is performed before said forming the dielectric layers.

Thus, the dielectric layers of the hard mask will have the same structure formed inside the etched part during the first etching step and above the contact.

According to one implementation, the first etching comprises: forming a specific third temporary mask covering the interconnection network in the contact region and uncovering the interconnection network in the dicing region, and removing said layers of the interconnection network in the dicing region until the semiconductor substrate is uncovered in the dicing region.

The formation of the third temporary mask, for example conventionally made of photosensitive lithographic resin, makes it possible to carry out "pre-etching" in the dicing region, independently of the etching in the contact region, removing in advance the layers of the interconnection network in the dicing region, before the formation per se of the opening of the dicing line.

According to one implementation, depositing the vertical dielectric layer is performed during said step of forming the dielectric layers.

Indeed, when said first etching is performed before hand, the formation of the dielectric layers comprises the deposition of the vertical dielectric layer covering the edges of the opening defining the dicing line.

According to one implementation, the second etching simultaneously comprises: removing the dielectric layers in the contact region until said metal contact is uncovered, and removing the dielectric layers in the dicing region until the semiconductor substrate is uncovered, so as to shape said pattern of the hard mask defining the dicing line.

The second etching makes it possible to simultaneously remove the same thickness of dielectric layers in the contact region and in the dicing region in a single step. The second etching can then be completed when the metal contact in the contact region and the substrate in the dicing region are uncovered, without for all that exposing the contact to prolonged etching and thus not causing metal dispersion in the vacuum chambers.

According to one implementation, the second etching comprises forming a fourth temporary mask having an opening in the contact region defining the uncovered region of the metal contact, and forming an opening in the dicing region defining the pattern of the hard mask such that a vertical portion of the dielectric layers covers the interconnection network laterally on an edge of the dicing region, in the pattern of the hard mask.

The dimensions of the opening of the fourth temporary mask in the dicing region (smaller and located inside the location of the opening of the third temporary mask) make it possible to keep, at the end of the removal of the dielectric layers, a vertical portion of dielectric layers protecting the interconnection network in the dicing line.

According to one implementation, the first etching is carried out by a reactive ion type plasma.

Reactive ion type plasma etching (referred to in the art as Reactive Ion Etching (RIE)) is a typical etching method using a chemical reaction between the material to be removed, i.e., that of the interconnection network layers and optionally the dielectric layers, and simultaneously with a firing of ions projected in a specific direction, usually perpendicular to the etched surface. The RIE process makes it possible, in particular, to remove material precisely and with no risk of damage of the neighboring material layers.

According to one implementation, the method further comprises plasma dicing of the semiconductor wafer into semiconductor chip devices singulated from one another, in the dicing line defined by the pattern of the hard mask.

According to another aspect, a semiconductor chip device delimited by an external edge is proposed, including a semiconductor substrate, an interconnection network provided with metal layers and at least one ultra-low dielectric constant dielectric layer, dielectric layers covering the interconnection network and having an opening uncovering a metal contact in a contact region, the interconnection network being covered by a vertical dielectric layer on the external edge of the chip.

According to one embodiment, the vertical dielectric layer is configured to cover the interconnection network on the external edge of the chip along the entire perimeter of the semiconductor device.

According to one embodiment, the vertical dielectric layer comprises a material chosen from silicon nitride or silicon oxide.

According to one embodiment, the vertical dielectric layer comprises a vertical portion of the dielectric layers covering the interconnection network on the external edge of the chip.

According to another aspect, a semiconductor wafer is proposed, capable of being diced into semiconductor chip devices singulated from each other, including a semiconductor substrate, an interconnection network provided with metal layers and at least one ultra-low dielectric constant dielectric layer, at least one contact region and at least one dicing region, the wafer including a hard mask wherein the pattern defines the dicing line, the hard mask comprising: dielectric layers disposed on the wafer in the contact region; an opening in the dicing region defining the dicing line; an opening in the contact region uncovering a metal contact of the interconnection network, the uncovered surface of the metal contact, the wafer furthermore including a vertical dielectric layer covering the edges of the opening defining the dicing line.

BRIEF DESCRIPTION OF THE DRAWINGS

Other advantages and features of the invention will appear upon examining the detailed description of non-limiting embodiments and implementations, and from the appended drawings, wherein:

FIGS. 2 to 6 illustrate steps of forming a hard mask configured for dicing the wafer by plasma, according to a first alternative;

DETAILED DESCRIPTION

Figure 1:
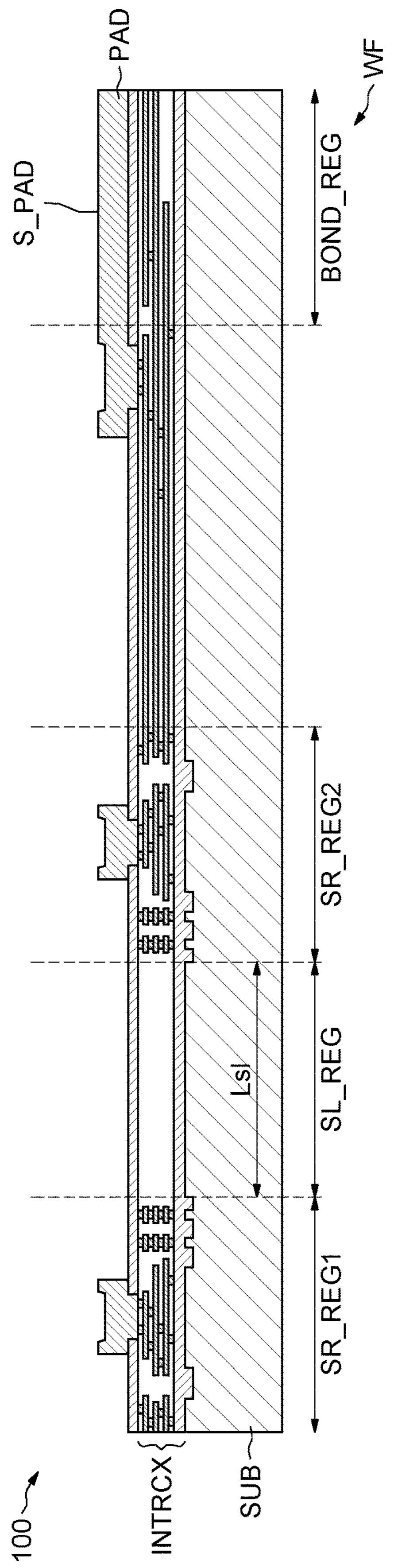
FIG. 1 schematically illustrates the result of a step of a method for dicing a semiconductor wafer.

FIG. 1 schematically illustrates the result of a step 100 of a method for dicing a semiconductor wafer WF.

The step 100 comprises obtaining a semiconductor wafer WF including a semiconductor substrate SUB and an interconnection network INTRCX. The interconnection network INTRCX typically comprises at least one ultra-low dielectric constant dielectric layer formed from an "ultra-low dielectric constant dielectric material", i.e. a material having a dielectric constant "k" or "kappa" less than 95% of the dielectric constant value of the silicon oxide.

Moreover, the semiconductor wafer WF includes several dicing regions SL_REG and several contact regions BOND_REG. The dicing regions SL_REG can have a width less than 100 μm and can be distributed on the wafer so as to form an array of semiconductor chip devices wherein each dicing region has a "row" or a "column" of the array. In particular, the dicing regions SL_REG are the regions of the wafer where the dicing is carried out for singulating the chips from the wafer and the contact regions BOND_REG are regions of the wafer where electric connections can be made, for example with a probe. For simplification purposes, only one dicing region SL_REG and one contact region BOND_REG have been represented in FIG. 1 and the following figures. In a non-limiting manner, the semiconductor wafer WF can also include regions for forming a sealing ring SR_REG1 and SR_REG2.

The interconnection network INTRCX covers the substrate SUB of the wafer WF. In particular, the interconnection network INTRCX covering the substrate SUB in the regions BOND_REG, SR_REG1, SR_REG2 is equipped with metal levels singulated by inter-metal dielectric layers having an ultra-low dielectric constant. The interconnection network INTRCX covering the substrate SUB in the dicing region SL_REG comprises at least one ultra-low dielectric constant dielectric layer and is free from metal layers.

The semiconductor wafer WF also comprises a metal contact PAD located above the interconnection network INTRCX in the contact region BOND_REG.

FIGS. 2 to 6 illustrate steps of forming a hard mask HM configured for dicing the wafer WF by plasma, according to a first alternative.

Figure 2:
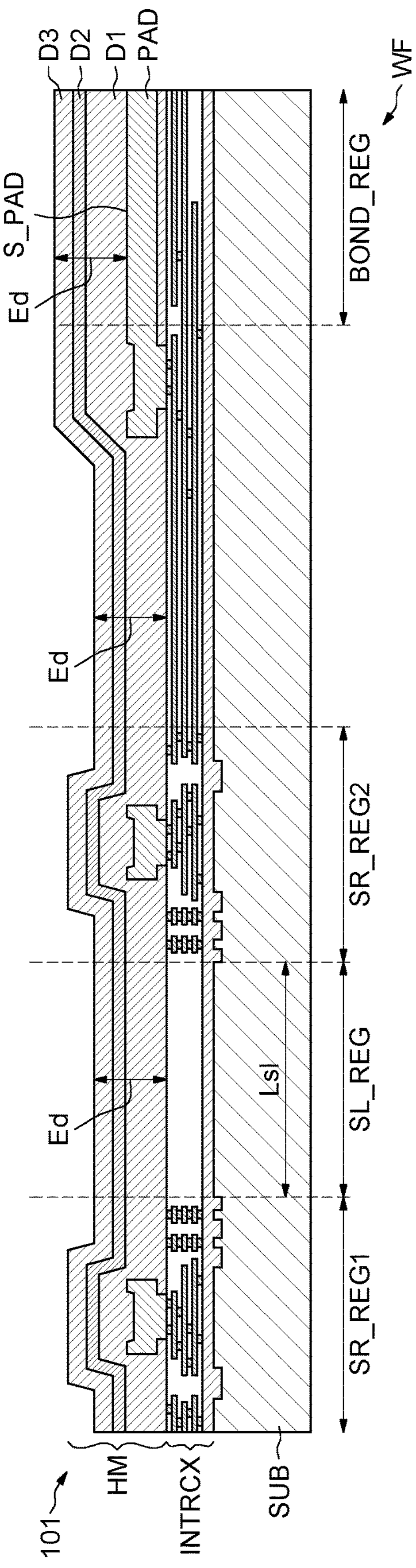

FIG. 2 schematically illustrates the result of a step 101 of forming dielectric layers D1, D2, D3. These dielectric layers particularly comprise two said "passivation" layers referenced D1 and D2 but can also comprise several additional passivation layers. The passivation layers D1 and D2 typically make it possible to protect the layers of materials covered thereby against damage that may be caused by the etching steps or corrosion. In particular, the dielectric layers D1, D2 and D3 are deposited uniformly and successively in the order of the references on the semiconductor wafer WF and more specifically on the interconnection network INTRCX in the dicing region SL_REG and on the metal contact PAD in the contact region BOND_REG.

For example, the material of the dielectric layers D1 and D3 is silicon oxide ($SiO_2$) and the material of the dielectric layer D2 is silicon nitride (SiN). The dielectric layers D1, D2 and D3 have a thickness Ed together.

FIG. 3 schematically illustrates the result of a first etching step 102. The step 102 is an etching of an opening in the dicing region SL_REG through the dielectric layers D1, D2, D3 and through the layers of the interconnection network INTRCX.

The first etching step 102 comprises more specifically a formation of a first temporary mask RES1 and a removal of the dielectric layers D1, D2, D3 and the layers of the interconnection network INTRCX in the dicing region SL_REG.

The temporary mask RES1, which is typically made of photosensitive resin, covers the dielectric layers D1, D2, D3 in the contact region BOND_REG and uncovers the dielectric layers D1, D2, D3 in the dicing region SL_REG.

The dielectric layers D1, D2, D3 and the layers of the interconnection network INTRCX are then removed until the semiconductor substrate SUB is uncovered. Advantageously, the removal of these layers is carried out by reactive ion etching.

Reactive ion etching (RIE) is an etching method, known to a person skilled in the art, making it possible to remove material precisely and with no risk of damage of the neighboring material layers. In other words, this etching method particularly makes it possible to remove the layers of the interconnection network INTRCX without any risk of forming delaminations in the layers of the interconnection network INTRCX located on the edges of the opening in the dicing region SL_REG.

Indeed, the etching of the layers of the interconnection network INTRCX of the step 102 can, for example, be identical or set in the same way as the etchings made in the ultra-low dielectric constant inter-metal dielectric regions, during the manufacture of said interconnection network.

Moreover, plasma etching has the advantage of forming a narrower dicing line than a dicing line that would have been produced indirectly by prior laser grooving.

The hard mask HM thus has a pattern resulting from the first etching step 102 and defining the dicing line in the dicing region SL_REG.

FIG. 4 schematically illustrates the result of a step 103 of depositing a conforming layer of silicon nitride (SiN) on the entire semiconductor wafer WF. In particular, the layer of silicon nitride deposited during the step 103 covers the dielectric layer D3 in the contact region BOND_REG and covers the semiconductor substrate SUB in the dicing region SL_REG. Such a deposition 103 particularly makes it possible to deposit the layer of silicon nitride in the dicing region such that a portion of the layer of silicon nitride, corresponding to a vertical dielectric layer BUFF1, covers the edges of the opening defining the dicing line.

Alternatively, the step 103 is a step of depositing a conforming layer of silicon nitride on the entire semiconductor wafer WF.

The additional layer of silicon nitride or silicon oxide therefore makes it possible to protect an external edge FL of the layers of the interconnection network INTRCX located on the edges of the dicing line.

Figure 5:
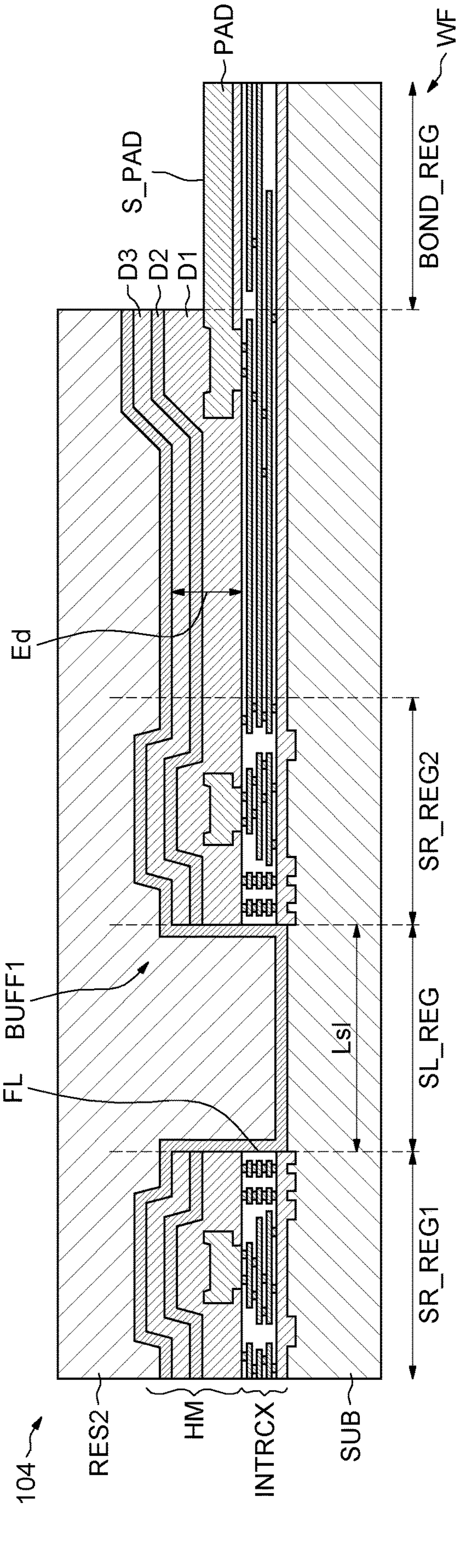

FIG. 5 schematically illustrates the result of a second etching step 104. The step 104 is more specifically an etching of an opening in the contact region BOND_REG uncovering the metal contact PAD.

The second etching step 104 comprises a formation of a second temporary mask RES2 and a removal of the dielectric layers D1, D2, D3 at the contact region BOND_REG.

The second temporary mask RES2, typically made of photosensitive resin, covers the dicing region SL_REG and is particularly formed on the layer of silicon nitride or silicon oxide deposited in step 103. The layer of silicon nitride is typically a material which offers a superior adherence to the second temporary mask RES2 than other types of dielectric material such as silicon oxide or monocrystalline silicon of the substrate SUB. The second temporary mask RES2 uncovers, furthermore, the dielectric layers D1, D2, D3 as well as the layer of silicon nitride in the contact region BOND_REG.

The dielectric layers D1, D2, D3, the layer of silicon nitride or silicon oxide and the layers of the interconnection network INTRCX are then removed until a surface S_PAD of the metal contact PAD is uncovered.

The dicing method also comprises an intermediate step of removing the second temporary mask RES2 (not illustrated). The second temporary mask RES2 can be removed by wet chemistry not constrained by the risk of damage of the ultra-low dielectric constant dielectric layers. Indeed, the uniform layer of silicon nitride or silicon oxide which covers the edges of the dicing line makes it possible to protect the external edge FL of the layers of the interconnection network INTRCX, and therefore makes it possible to prevent delaminations in the layers of the interconnection network INTRCX.

The second etching, carried out independently of the first etching, can thus be optimized and configured specifically for the manufacture of the metal contact PAD, without for all that causing damage to the ultra-low constant dielectric layers, given that the latter are protected by the vertical dielectric layer BUFF1.

Figure 6:
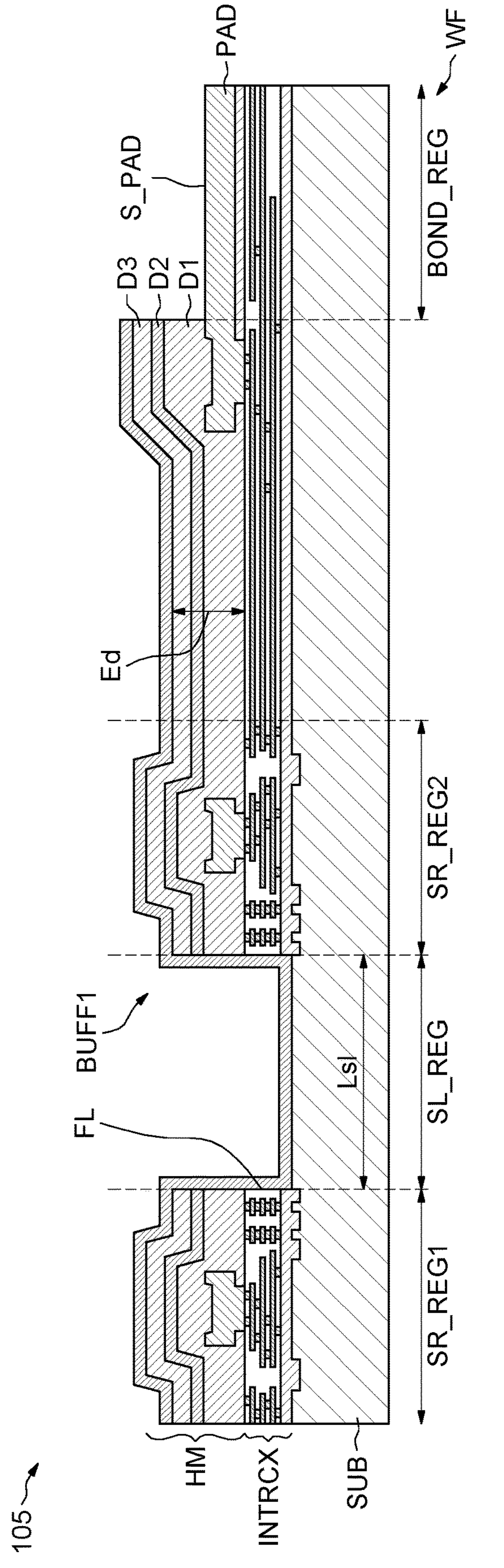

FIG. 6 schematically illustrates the result of a chemical treatment step 105. The chemical treatment is carried out after removing the second temporary mask RES2 and typically uses a dioxygen plasma ($O_2$) configured for cleaning the surface S_PAD of the metal contact PAD.

FIGS. 7 to 10 illustrate steps of forming a hard mask HM of the method for dicing the wafer by plasma, according to a second alternative.

Figure 7:
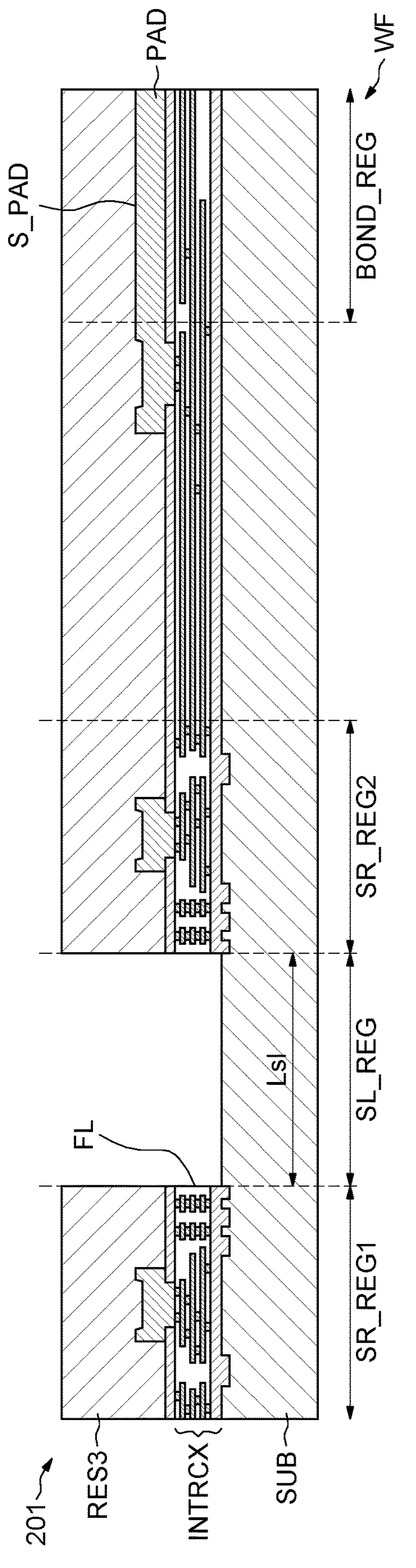
FIGS. 7 to 10 illustrate steps of forming a hard mask configured for dicing the wafer by plasma, according to a second alternative.

FIG. 7 schematically illustrates the result of a first etching step 201 carried out using the wafer WF described above with reference to FIG. 1. The step 201 is an etching of an opening in the dicing region SL_REG through the layers of the interconnection network INTRCX.

The first etching step 201 comprises a formation of a third temporary mask RES3 and a removal of the layers of the interconnection network INTRCX.

The third temporary mask RES3, typically made of photosensitive resin, covers the interconnection network INTRCX in the contact region BOND_REG and uncovers the interconnection network INTRCX in the dicing region SL_REG.

The layers of the interconnection network INTRCX are then removed until the substrate SUB is uncovered in the dicing region SL_REG. Advantageously, the removal of these layers is carried out by reactive ion etching (RIE).

Figure 8:
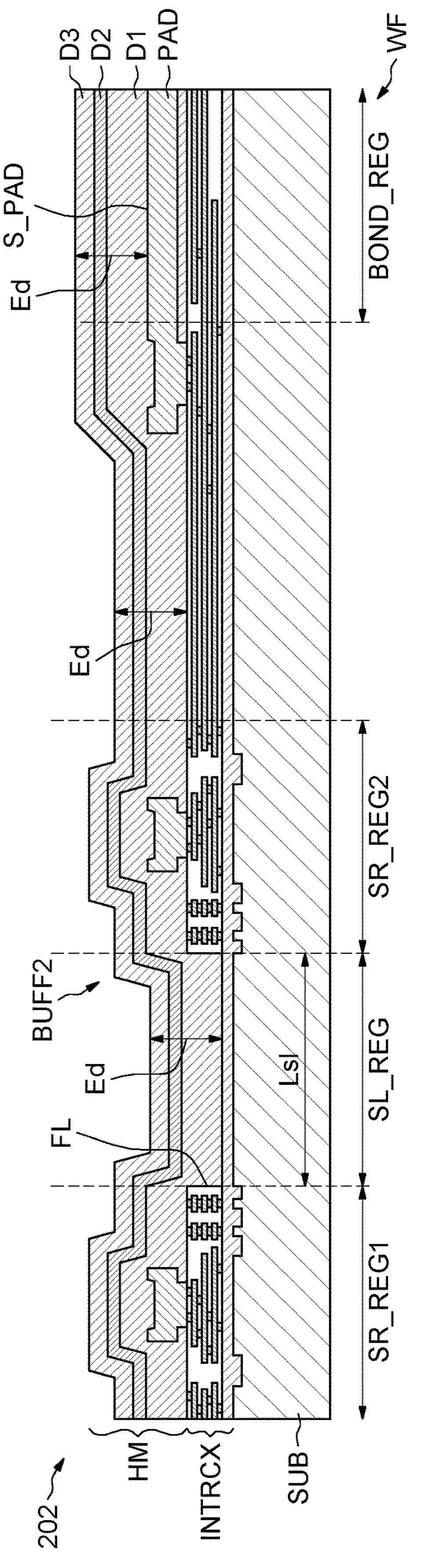

FIG. 8 illustrates the result of a step 202 of forming dielectric layers D1, D2 and D3 (after removal of the third temporary mask RES3). The dielectric layers D1 and D2 represent said "passivation" layers described above with the same references in relation to FIGS. 2 to 6 without however being limiting in terms of the number of dielectric layers. The dielectric layers D1, D2, D3 can have materials and a common thickness Ed identical to those described above in relation to FIG. 2. More specifically, the dielectric layers D1, D2, D3 are formed uniformly on the semiconductor wafer such that the thickness Ed is equivalent, or equal in the dicing region SL_REG and in the contact region BOND_REG.

In particular, a vertical portion of the dielectric layers D1, D2 and D3 covers the edge FL of the layers of the interconnection network INTRCX located on the edges of the opening of the dicing line made in step 201. The vertical portion of the dielectric layers D1, D2, D3 corresponds to the vertical dielectric layer BUFF2, which will have the same function of protecting the external edge FL of the layers of the interconnection network INTRCX described above in relation to FIG. 4.

The dielectric layers D1, D2, D3 of the hard mask HM will have the same structure formed inside the etched part during the first etching step 201 and above the contact PAD.

Figure 9:
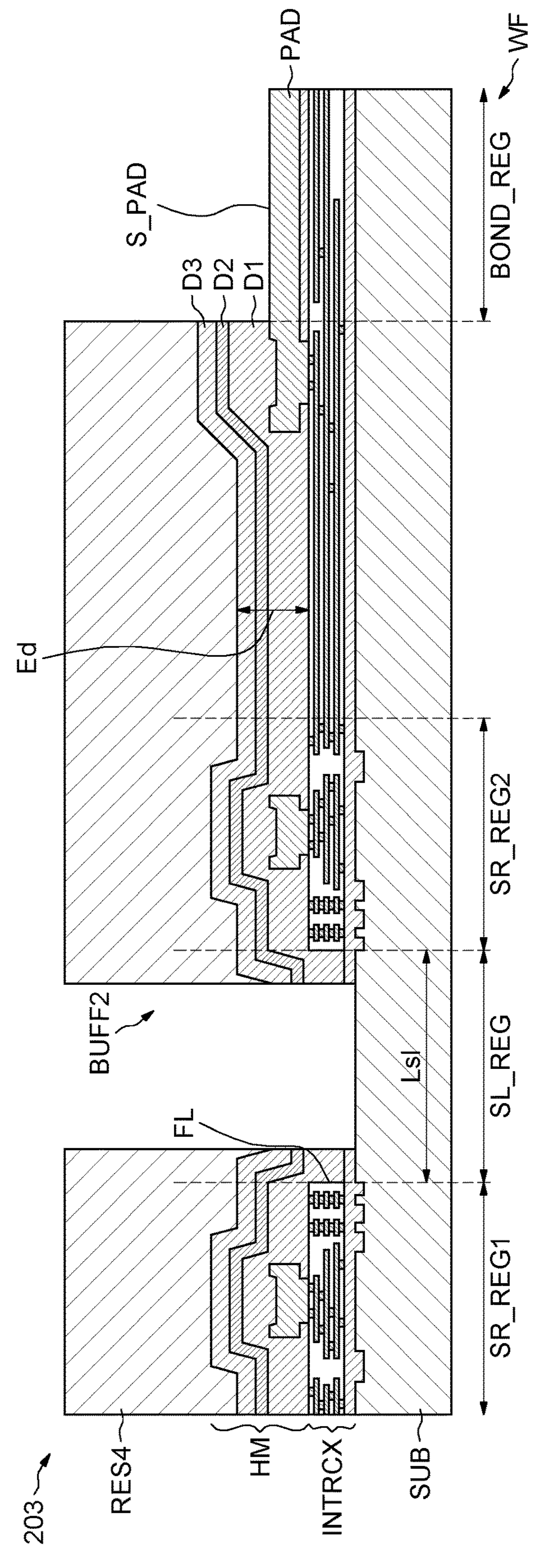

FIG. 9 schematically illustrates the result of a second etching step 203.

The second etching step 203 comprises a formation of a fourth temporary mask RES4 on the dielectric layers D1, D2, D3 of the wafer. The fourth temporary mask RES4, typically made of resin, has an opening in the contact region BOND_REG and an opening in the dicing region SL_REG. More specifically, the fourth temporary mask RES4 covers the vertical portion of the dielectric layers D1, D2 and D3 in the dicing region SL_REG.

The second etching step 203 comprises a removal of the dielectric layers D1, D2, D3 in the contact region BOND_REG and in the dicing region SL_REG. The dielectric layers D1, D2, D3 under the opening of the mask RES4 in the contact region BOND_REG are removed until the metal contact PAD is uncovered and those under the opening of the mask RES4 in the dicing region SL_REG are removed until the substrate SUB is uncovered.

Thus, an equal thickness Ed of dielectric layers D1, D2, D3 is removed, in the same etching step, in the dicing region SL_REG and in the contact region BOND_REG while keeping the vertical portion of dielectric layers D1, D2, D3 corresponding to the vertical dielectric layer BUFF2.

The second etching step 203 can then be completed when the metal contact PAD in the contact region BOND_REG and the substrate SUB in the dicing region SL_REG are uncovered without for all that exposing the contact region BOND_REG to prolonged etching and thus not causing metal dispersion in the vacuum chambers.

Furthermore, the dimensions of the opening of the fourth temporary mask RES4 in the dicing region SL_REG (smaller and located inside the location of the opening of the third temporary mask RES3) make it possible to keep, at the end of the removal of the dielectric layers, a vertical portion of dielectric layers protecting the interconnection network INTRCX in the dicing line.

The hard mask HM thus has a pattern resulting from the second etching step 203 and defining the dicing line in the dicing region SL_REG.

Figure 10:
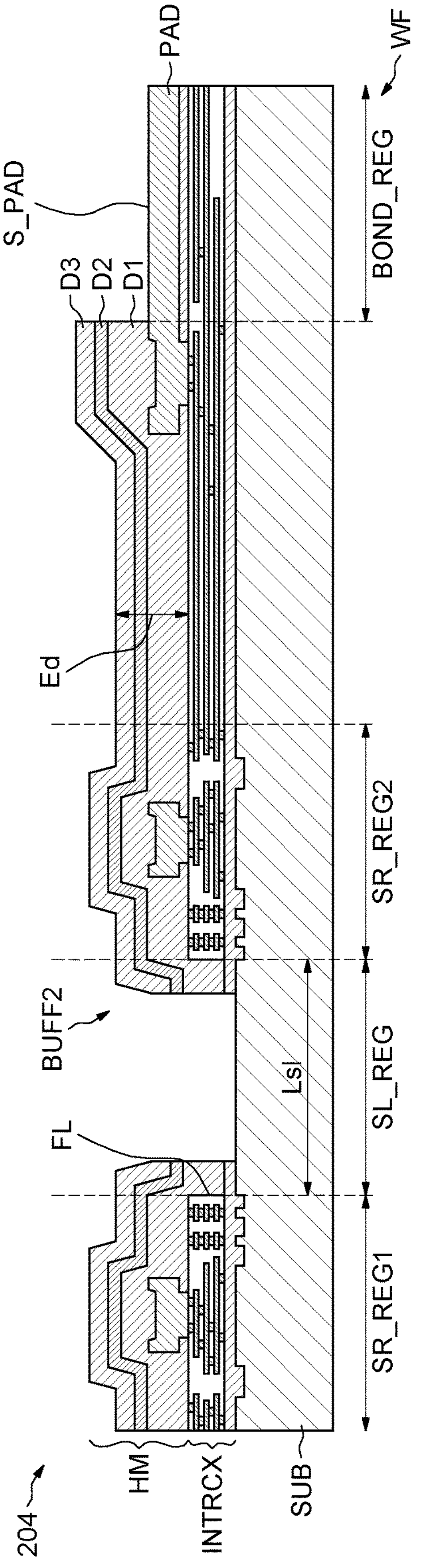

FIG. 10 schematically illustrates a result of a chemical treatment step 204 to remove the mask RES4. The step 204 is identical to the chemical treatment step described above in relation to FIG. 6. The vertical part CDV2 of the dielectric layers D1, D2, D3 protects the external edge FL of the interconnection network INTRCX of the dioxygen plasma used for cleaning the surface S_PAD of the metal contact PAD.

Figure 11:
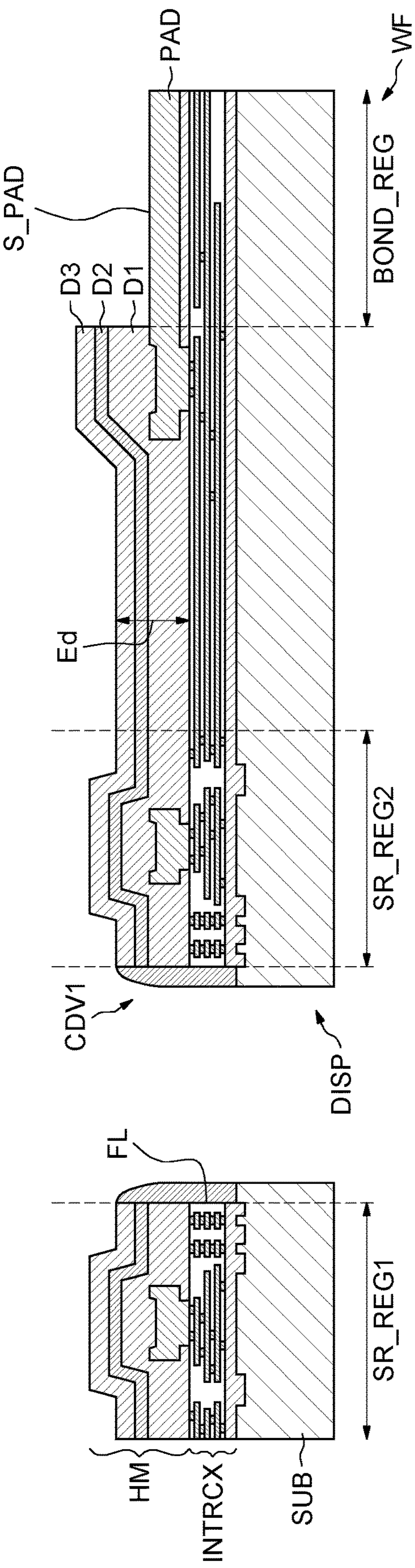
FIG. 11 illustrates an example of a semiconductor chip device obtained after implementing the dicing method according to the first alternative described above in relation to FIGS. 2 to 6.

FIG. 11 illustrates an example of a semiconductor chip device DISP obtained after implementing the dicing method according to the first alternative described above in relation to FIGS. 2 to 6.

Figure 12:
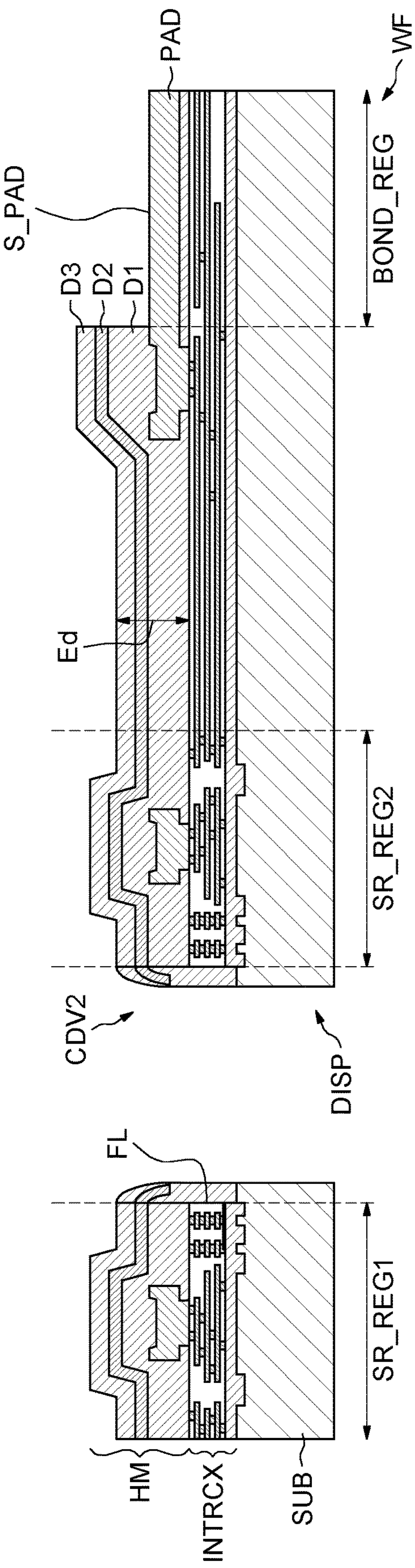
FIG. 12 illustrates an example of a semiconductor chip device obtained after implementing the dicing method according to the second alternative described above in relation to FIGS. 7 to 10.

FIG. 12 illustrates an example of a semiconductor chip device DISP obtained after implementing the dicing method according to the second alternative described above in relation to FIGS. 7 to 10.

In the two alternatives, the dicing method further comprises a step of plasma dicing of the semiconductor wafer WF into semiconductor chip devices singulated from one another DISP in the dicing line SL_REG defined by the pattern of the hard mask HM.

The semiconductor chip device DISP, as represented in FIG. 11, is delimited by an external edge FL of the chip. The semiconductor chip device DISP comprises a semiconductor substrate SUB and an interconnection network INTRCX equipped with metal levels singulated by inter-metal dielectric layers having an ultra-low dielectric constant. The interconnection network INTRCX is disposed on the semiconductor substrate SUB. The semiconductor chip device DISP also comprises dielectric layers D1, D2, D3 covering the interconnection network INTRCX and uncovering a metal contact PAD in a contact region BOND_REG.

The interconnection network INTRCX is covered with a vertical dielectric layer CDV1, for example with a layer of silicon nitride (or a layer of silicon oxide according to the material used during step 103 described above in relation to FIG. 4), on the external edge FL of the chip.

In an alternative illustrated in FIG. 12, the vertical dielectric layer CDV2 is a vertical portion of the dielectric layers D1, D2, D3 covering the interconnection network INTRCX on the external edge FL of the chip.

Moreover, the vertical dielectric layer CDV1, CDV2 extends along the external edge FL of the chip from the level of the substrate SUB, preferably along the entire interconnection network INTRCX, and has an arc-shaped outer face. Advantageously, the vertical dielectric layer CDV1, CDV2 is configured to cover the interconnection network INTRCX on the external edge FL of the chip, along the entire perimeter of the semiconductor device DISP.

The invention claimed is:

1. A method for dicing a semiconductor wafer which includes a semiconductor substrate, an interconnection network provided with metal layers and at least one ultra-low dielectric constant dielectric layer, at least one contact region and at least one dicing region, the method comprising:

forming a hard mask, wherein forming the hard mask comprises:

forming dielectric layers on the semiconductor wafer in the at least one contact region and in the at least one dicing region;

a first etching of an opening in the at least one dicing region extending through said metal layers of the interconnection network; and a second etching of an opening in the at least one contact region uncovering a surface of a metal contact of the interconnection network; and depositing a vertical dielectric layer covering edges of the opening in the at least one dicing region formed by the first etching to define a dicing line within the opening formed by the first etching; and then cleaning the uncovered surface of the metal contact using a chemical treatment.

2. The method according to claim 1, wherein said first etching is performed after forming the dielectric layers, with the opening in the at least one dicing region formed by the first etching extending through said dielectric layers and said layers of the interconnection network until the semiconductor substrate is uncovered so as to shape a pattern of the hard mask defining the dicing line.

3. The method according to claim 2, wherein the first etching comprises:

forming a first temporary mask which covers the dielectric layers in the at least one contact region and uncovers the dielectric layers in the at least one dicing region; and removing the dielectric layers and said metal layers of the interconnection network in the at least one dicing region until the semiconductor substrate is uncovered in the pattern of the hard mask.

4. The method according to claim 2, wherein depositing the vertical dielectric layer comprises depositing a conforming layer of a material selected from the group consisting of silicon nitride and silicon oxide on the entire semiconductor wafer.

5. The method according to claim 2, wherein the second etching comprises:

forming a second temporary mask covering the at least one dicing region and uncovering the dielectric layers in the at least one contact region; and removing the dielectric layers in the at least one contact region until the surface of the metal contact is uncovered.

6. The method according to claim 1, wherein the first etching is performed before forming the dielectric layers.

7. The method according to claim 6, wherein the first etching comprises:

forming a third temporary mask covering the interconnection network in the at least one contact region and uncovering the interconnection network in the at least one dicing region; and removing said metal layers of the interconnection network in the at least one dicing region until the semiconductor substrate is uncovered in the at least one dicing region.

8. The method according to claim 6, wherein depositing the vertical dielectric layer is performed during said forming the dielectric layers.

9. The method according to claim 6, wherein the second etching simultaneously comprises:

removing the dielectric layers in the contact region until the surface of said metal contact is uncovered; and removing the dielectric layers in the at least one dicing region until the semiconductor substrate is uncovered, so as to shape said pattern of the hard mask defining the dicing line.

10. The method according to claim 9, wherein depositing the vertical dielectric layer is performed during said forming the dielectric layers; and wherein the second etching comprises forming a fourth temporary mask having an opening in the at least one contact region defining the uncovered surface of the metal contact, and an opening in the at least one dicing region defining the pattern of the hard mask such that a vertical portion of the dielectric layers covers the interconnection network laterally on an edge of the at least one dicing region, in the pattern of the hard mask.

11. The method according to claim 1, wherein the first etching is carried out by a reactive ion type plasma.

12. The method according to claim 1, further comprising plasma dicing of the semiconductor wafer into semiconductor chip devices singulated from one another, said plasma dicing being performed in the dicing line defined by the pattern of the hard mask.

13. The method according to claim 1, wherein said at least one dicing region has a width less than 100 μm.

14. The method according to claim 6:

wherein the first etching comprises:

forming a third temporary mask covering the interconnection network in the at least one contact region and uncovering the interconnection network in the at least one dicing region; and removing said metal layers of the interconnection network in the at least one dicing region until the semiconductor substrate is uncovered in the at least one dicing region;

wherein depositing the vertical dielectric layer is performed during said forming the dielectric layers; and wherein the second etching simultaneously comprises:

removing the dielectric layers in the contact region until the surface of said metal contact is uncovered; and removing the dielectric layers in the at least one dicing region until the semiconductor substrate is uncovered, so as to shape said pattern of the hard mask defining the dicing line.

15. The method according to claim 14, wherein the second etching comprises forming a fourth temporary mask having an opening in the at least one contact region defining the uncovered surface of the metal contact, and an opening in the at least one dicing region defining the pattern of the hard mask such that a vertical portion of the dielectric layers covers the interconnection network laterally on an edge of the at least one dicing region, in the pattern of the hard mask.

* * * * *